(12) United States Patent
Huber et al.

(10) Patent No.: US 9,016,135 B2
(45) Date of Patent: Apr. 28, 2015

(54) STRESS SENSOR FOR MEASURING MECHANICAL STRESSES IN A SEMICONDUCTOR CHIP AND STRESS COMPENSATED HALL SENSOR

(75) Inventors: Samuel Huber, Kuessnacht am Rigi (CH); Arnaud Laville, Neuchatel (CH); Wouter Leten, Mol (BE); Christian Schott, Lussy-sur-Morges (CH)

(73) Assignee: Melexis Technologies NV, Tessenderlo (BE)

( * ) Notice: Subject to any disclaimer, the term of this patent is extended or adjusted under 35 U.S.C. 154(b) by 364 days.

(21) Appl. No.: 13/397,803

(22) Filed: Feb. 16, 2012

(65) Prior Publication Data

US 2012/0210800 A1 Aug. 23, 2012

(30) Foreign Application Priority Data

Feb. 18, 2011 (CH) .......................................... 282/11
Dec. 21, 2011 (CH) ........................................ 2020/11

(51) Int. Cl.
| | |
|---|---|
| *G01L 1/00* | (2006.01) |
| *H01L 27/14* | (2006.01) |
| *G01R 33/00* | (2006.01) |
| *G01D 3/036* | (2006.01) |
| *G01L 1/22* | (2006.01) |
| *G01L 5/16* | (2006.01) |

(52) U.S. Cl.
CPC .......... *G01R 33/0082* (2013.01); *G01D 3/0365* (2013.01); *G01L 1/2262* (2013.01); *G01L 1/2281* (2013.01); *G01L 1/2293* (2013.01); *G01L 5/162* (2013.01)

(58) Field of Classification Search
CPC ............ G01N 3/08; G01N 2203/0016; G01N 2203/0032; G01N 2203/0042; G01N 2203/005
See application file for complete search history.

(56) References Cited

U.S. PATENT DOCUMENTS

| | | | |
|---|---|---|---|
| 4,672,411 A | 6/1987 | Shimizu et al. | |
| 5,406,202 A * | 4/1995 | Mehrgardt et al. | ........... 324/251 |
| 6,768,301 B1 | 7/2004 | Hohe et al. | |
| 7,009,268 B2 * | 3/2006 | Yang et al. | ................... 257/467 |
| 7,474,093 B2 * | 1/2009 | Ausserlechner | .............. 324/244 |
| 2005/0001487 A1 | 1/2005 | Ausserlechner | |
| 2005/0162160 A1 | 7/2005 | Ausserlechner et al. | |
| 2006/0043508 A1 | 3/2006 | Ohta et al. | |
| 2006/0207339 A1 * | 9/2006 | Sumigawa et al. | .............. 73/777 |
| 2008/0074108 A1 | 3/2008 | Ausserlechner | |
| 2009/0108839 A1 | 4/2009 | Ausserlechner | |
| 2012/0075027 A1 * | 3/2012 | van Beek et al. | ................ 331/70 |

FOREIGN PATENT DOCUMENTS

| | | |
|---|---|---|
| DE | 4302342 A1 | 7/1993 |
| DE | 10154495 A1 | 5/2003 |

(Continued)

*Primary Examiner* — Lisa Caputo
*Assistant Examiner* — Brandi N Hopkins
(74) *Attorney, Agent, or Firm* — McCormick, Paulding & Huber LLP

(57) ABSTRACT

A stress sensor (1) for detecting mechanical stress in a semiconductor chip (2) has a Wheatstone bridge formed by four integrated resistors $R_1$ to $R_4$, the resistors $R_1$ and $R_4$ being p-type resistors and the resistors $R_2$ and $R_3$ being n-type resistors.

16 Claims, 10 Drawing Sheets

(56) References Cited

FOREIGN PATENT DOCUMENTS

Figure 1:
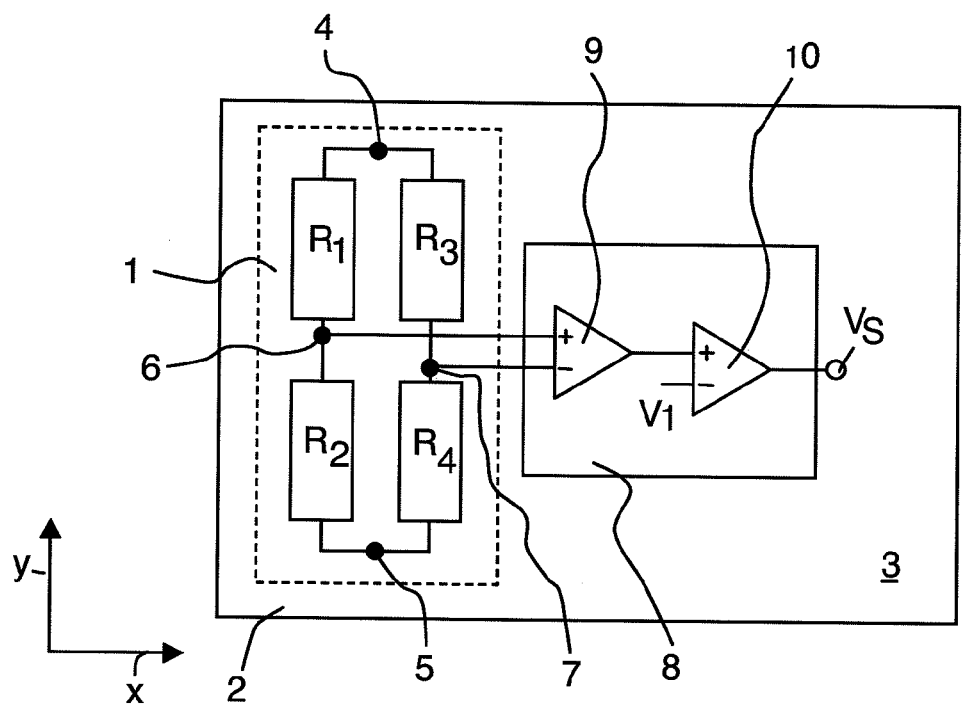

| | | |
|---|---|---|
| DE | 10154498 A1 | 5/2003 |
| DE | 102006045141 B3 | 4/2008 |
| DE | 102008051949 A1 | 5/2009 |
| DE | 102004003853 B4 | 12/2009 |
| EP | 146709 B1 | 7/1990 |
| EP | 548391 B1 | 7/1997 |
| EP | 1496344 A2 | 7/2004 |
| WO | 0118556 A1 | 3/2001 |

* cited by examiner

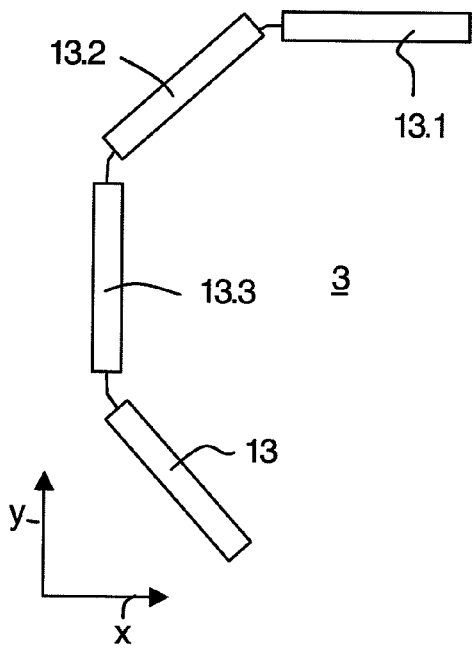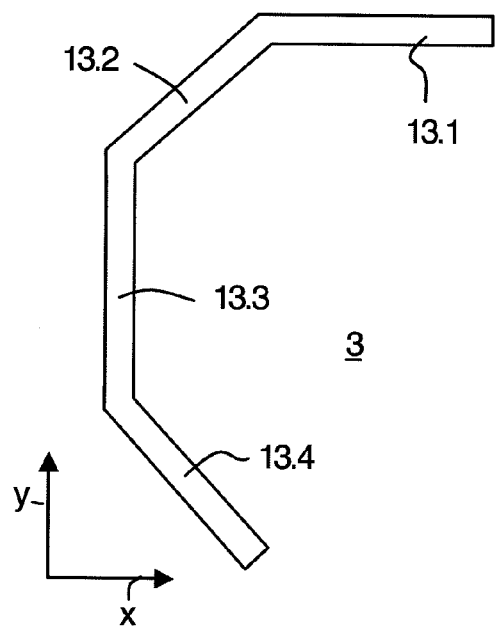
Fig. 3A          Fig. 3B
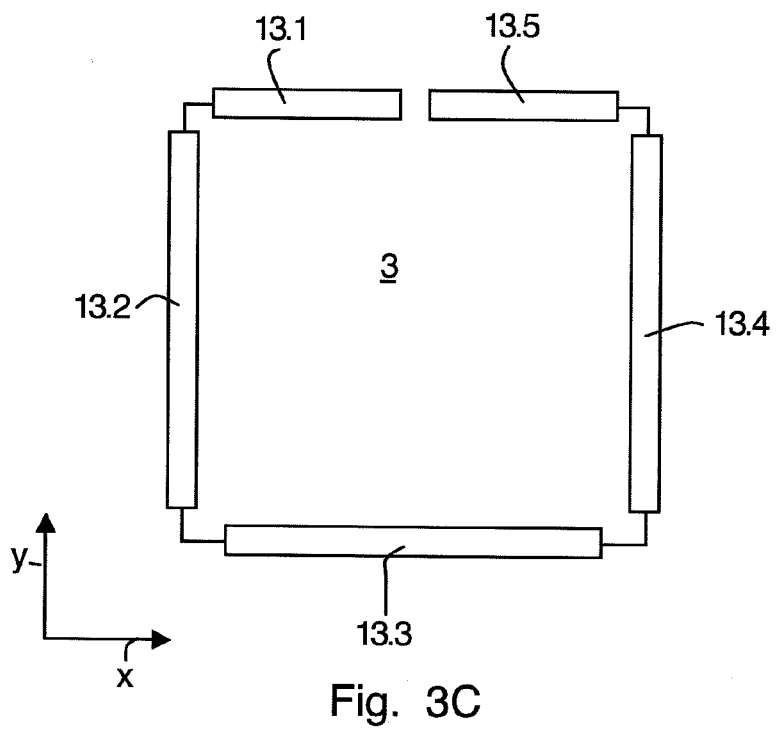
Fig. 3C

STRESS SENSOR FOR MEASURING MECHANICAL STRESSES IN A SEMICONDUCTOR CHIP AND STRESS COMPENSATED HALL SENSOR

PRIORITY CLAIM

Applicant hereby claims foreign priority under 35 U.S.C§119 from Swiss Application No. 282/11 filed Feb. 18, 2011 and from Swiss Application No. 2020/11 filed Dec. 21, 2011, the disclosures of which are herein incorporated by reference.

FIELD OF THE INVENTION

The invention relates to a stress sensor for detecting mechanical stress in a semiconductor chip and a stress-compensated Hall sensor.

BACKGROUND OF THE INVENTION

Hall sensors are magnetic field sensors, which are based on the Hall effect and deliver an electrical output signal, which is proportional to a predetermined component of the magnetic field. A Hall sensor comprises a Hall element or a cluster of Hall elements and an electronic circuit for the operation of the Hall elements and the analysis of the output signals of the Hall elements. The Hall sensor is produced as an integrated circuit, which is embedded in a semiconductor chip. The semiconductor chip is packaged in a housing. Hall elements have an offset, which originates from deviations caused by processing and geometry. The offset can be effectively reduced by the parallel connection of multiple Hall elements (cluster) and/or operation using the known spinning current method. This is known from manifold patent documents, e.g. U.S. Pat. Nos. 6,768,301, 5,406,202, DE 4302342.

The semiconductor chip packaged in the housing is subjected to mechanical stress, which is dependent on environmental influences such as temperature and humidity, etc. The alternating mechanical stress causes changes of the offset of the Hall elements and, because of the piezo-Hall effect, also changes of the sensitivity of the Hall elements. Changes of the offset are effectively suppressed by the above-described measures. Employing a stress sensor, which detects the mechanical stress, and using its output signal to compensate for the change of the sensitivity of the Hall element caused by the piezo-Hall effect to compensate for the changes of the sensitivity is known, for example, from US 2005001487, DE 10154498, US 2005162160, US 2009108839.

SUMMARY OF THE INVENTION

The invention is based on the objects of compensating for the change of the sensitivity of a Hall element caused by the piezo-Hall effect in the simplest possible way and developing a substantially stress-compensated Hall sensor.

According to the invention a stress sensor for detecting mechanical stress in a semiconductor chip has resistors integrated in an active surface of the semiconductor chip. The integrated resistors comprise four integrated resistors $R_1$ to $R_4$, which form a Wheatstone bridge, in which the resistors $R_1$ and $R_2$ are connected in series, the resistors $R_3$ and $R_4$ are connected in series and in parallel to the resistors $R_1$ and $R_2$, the resistors $R_1$ and $R_3$ having a common node and the resistors $R_2$ and $R_4$ having a common node. The resistors $R_1$ and $R_4$ are p-type resistors and the resistors $R_2$ and $R_3$ are n-type resistors. The resistors $R_1$ to $R_4$ preferably have the same nominal value.

Preferably, each of the n-type resistors $R_2$ and $R_3$ consists of oblong resistor sections, which are connected to one another directly or via electrical conductors. Each of the resistor sections has a predetermined orientation in the plane defined by the active surface of the semiconductor chip. A sum of the resistance values of all resistor sections which have a first orientation and belong to the same resistor $R_2$ or $R_3$, and a sum of the resistance values of all resistor sections which have a second orientation rotated by 90° to the first orientation and also belong to the same resistor $R_2$ or $R_3$, have the same nominal value.

Preferably, each of the p-type resistors $R_1$ and $R_4$ consists of oblong resistor sections, which are connected to one another directly or via electrical conductors. Each of the resistor sections has a predetermined orientation in the plane defined by the active surface of the semiconductor chip. A sum of the resistance values of all resistor sections which have a first orientation and belong to the same resistor $R_1$ or $R_4$, and a sum of the resistance values of all resistor sections which have a second orientation rotated by 90° to the first orientation and also belong to the same resistor $R_1$ or $R_4$, have the same nominal value.

Preferably, the resistor sections of the n-type resistors $R_2$ and $R_3$ and the resistor sections of the p-type resistors $R_1$ and $R_4$ enclose an angle of 45° or −45°.

Preferably, the base material is (100) silicon, the edges of the semiconductor chip extend parallel and orthogonal to the <110> crystal direction, the resistor sections of the n-type resistors $R_2$ and $R_3$ extend parallel or orthogonal to the <110> crystal direction, and the resistor sections of the p-type resistors $R_1$ and $R_4$ extend parallel or orthogonal to the <100> crystal direction.

Each of the p-type resistors $R_1$ and $R_4$ may be an oblong resistor, which is rotated by 45° or −45° in relation to an edge of the semiconductor chip.

Each of the resistors $R_1$, $R_2$, $R_3$ and $R_4$ may be an oblong resistor, which is rotated by 45° or −45° in relation to an edge of the semiconductor chip.

Preferably, the n-type resistors $R_2$ and $R_3$ comprise comparatively heavily doped and comparatively lightly doped semiconductor material, which are combined so that the temperature drift of the stress-dependent resistance change of the n-type resistors $R_2$ and $R_3$ is equal to the piezo-Hall temperature coefficient.

Preferably, the p-type resistors $R_1$ and $R_4$ comprise comparatively heavily doped and comparatively lightly doped semiconductor material, these semiconductor materials being combined so that the temperature drift of the stress-independent resistance change of the p-type resistors $R_1$ and $R_4$ is equal to the temperature drift of the stress-independent resistance change of the n-type resistors $R_2$ and $R_3$.

A Hall sensor comprises at least one Hall element and at least one stress sensor according to the invention. The output signal of the at least one stress sensor is used to stress-compensate the output signal of the at least one Hall element.

The Hall sensor preferably comprises at least two current sources for applying a current to the at least one Hall element, an output signal of the stress sensor controlling one of the at least two current sources.

The Hall sensor might comprise at least five stress sensors, which are arranged along two axes extending orthogonally to one another. A single output signal is formed from the output signals of the stress sensors, in order to stress-compensate the output signal of the at least one Hall element.

BRIEF DESCRIPTION OF THE DRAWING FIGURES

Figure 2:
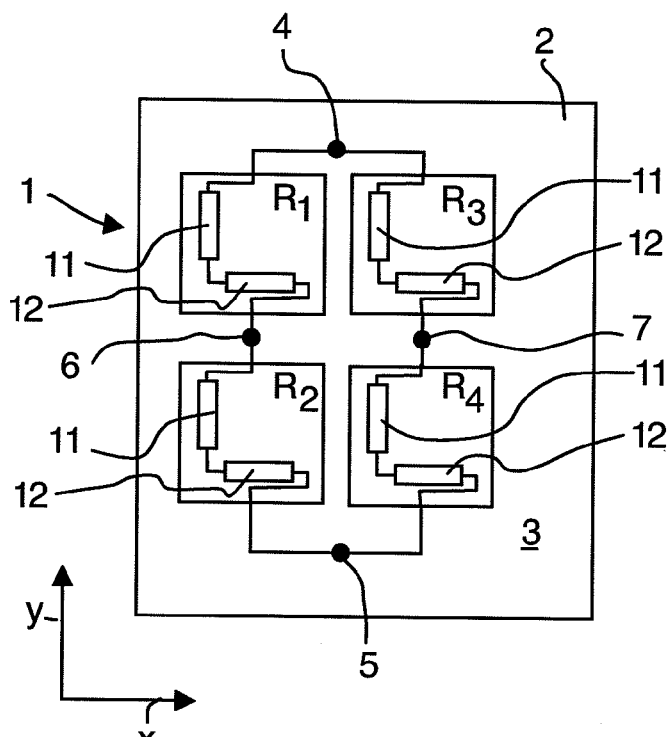
Figure 3D:
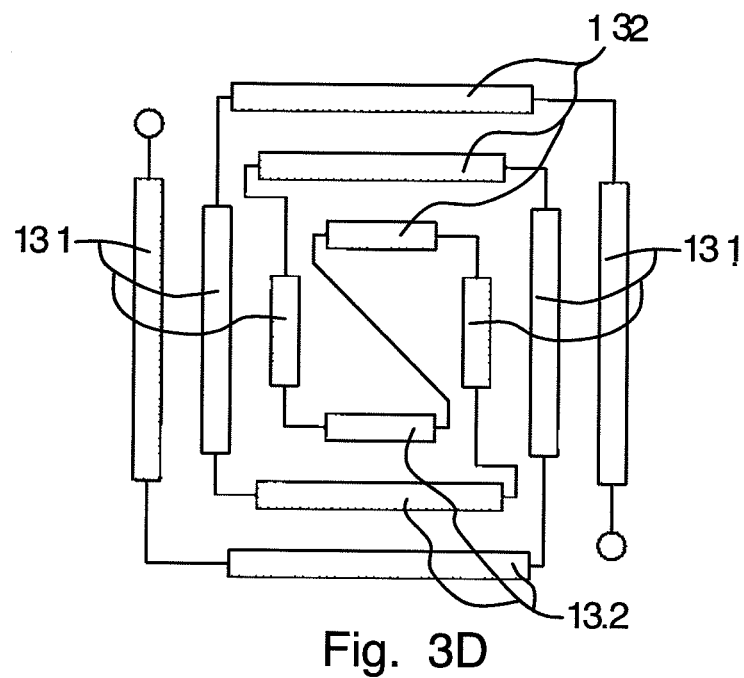
Figure 4:
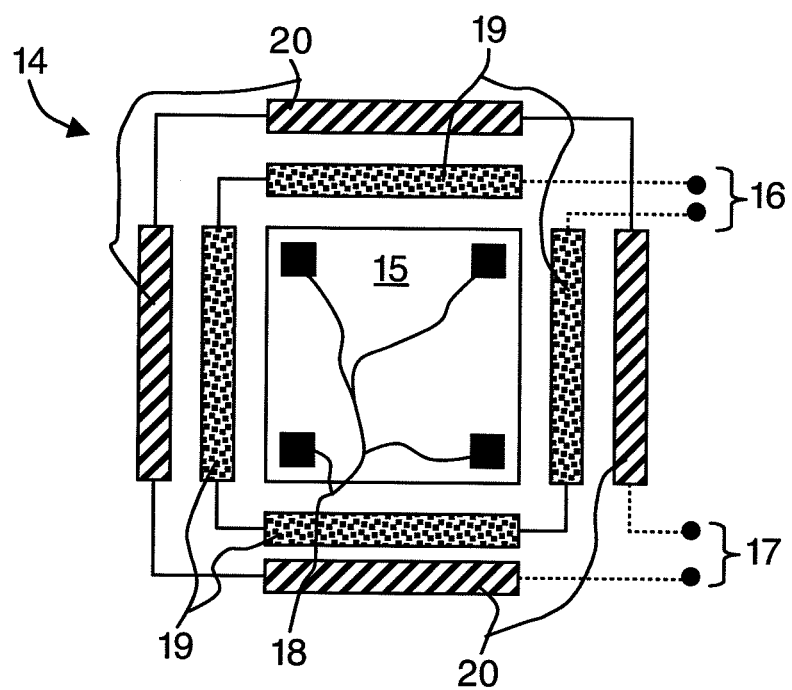
Figure 5:
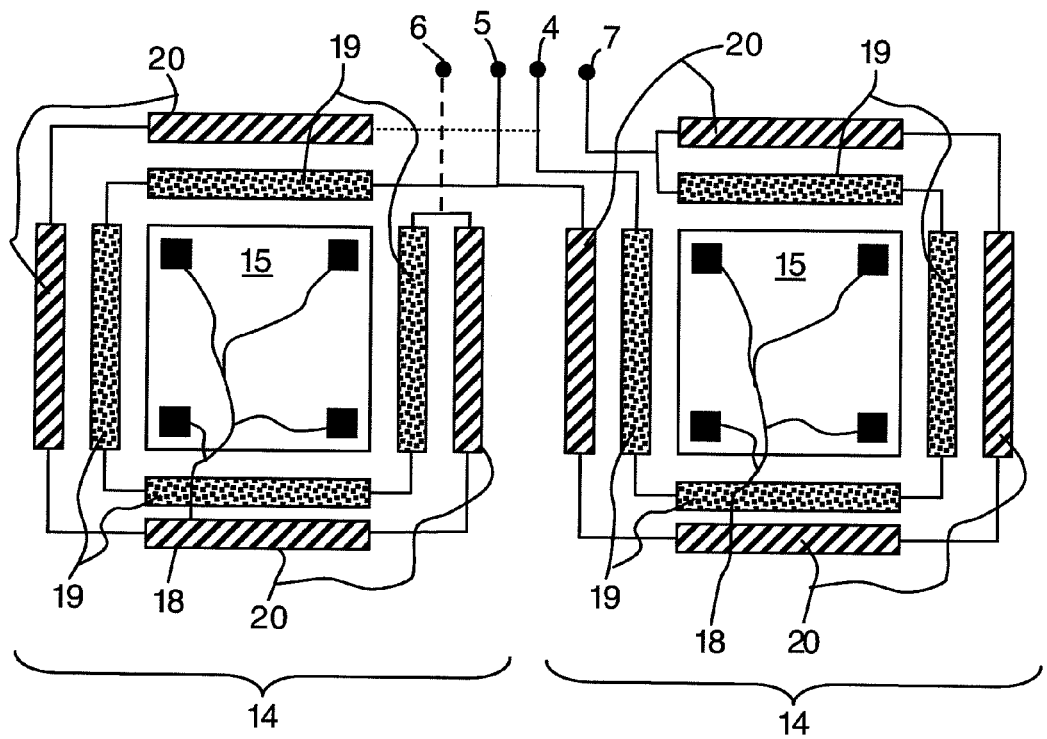
Figure 6:
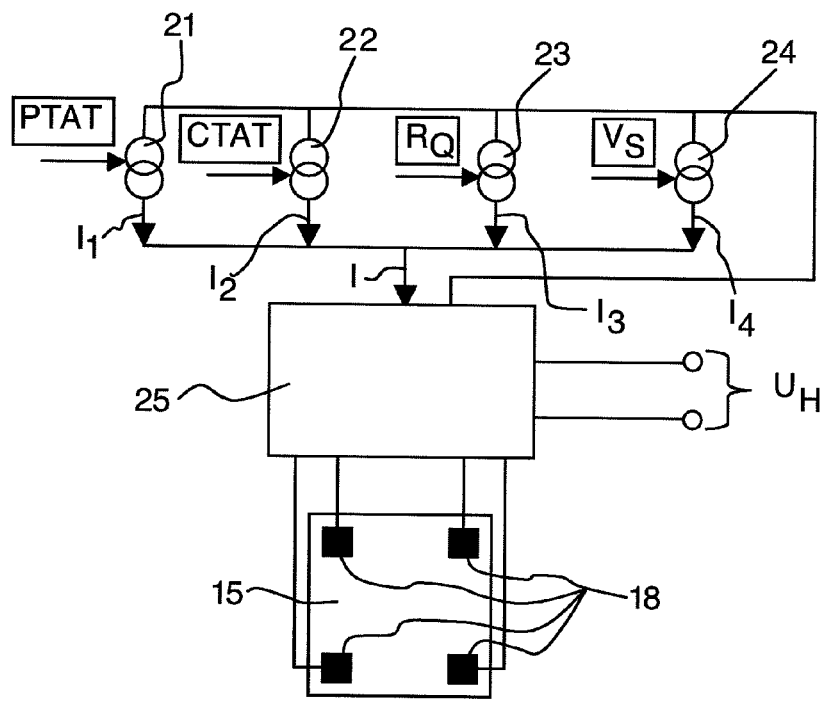
Figure 7:
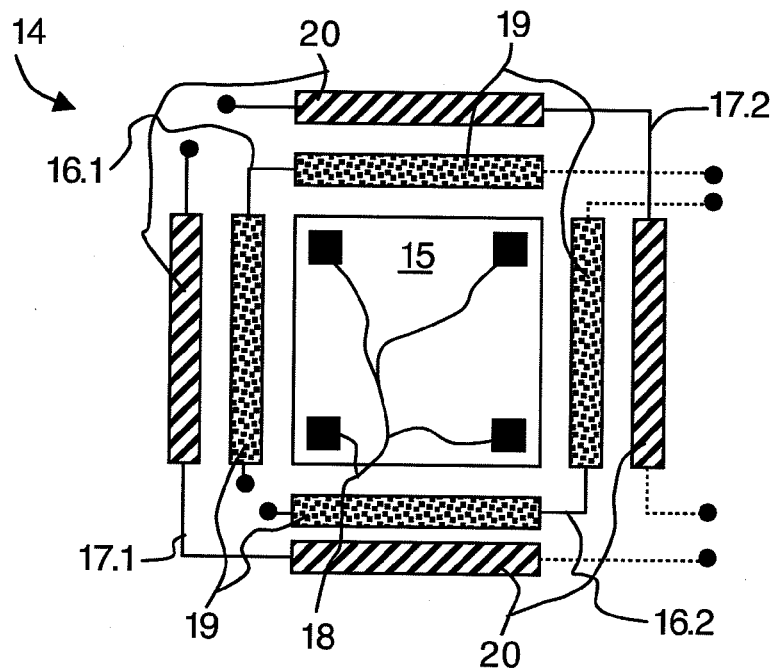
Figure 8:
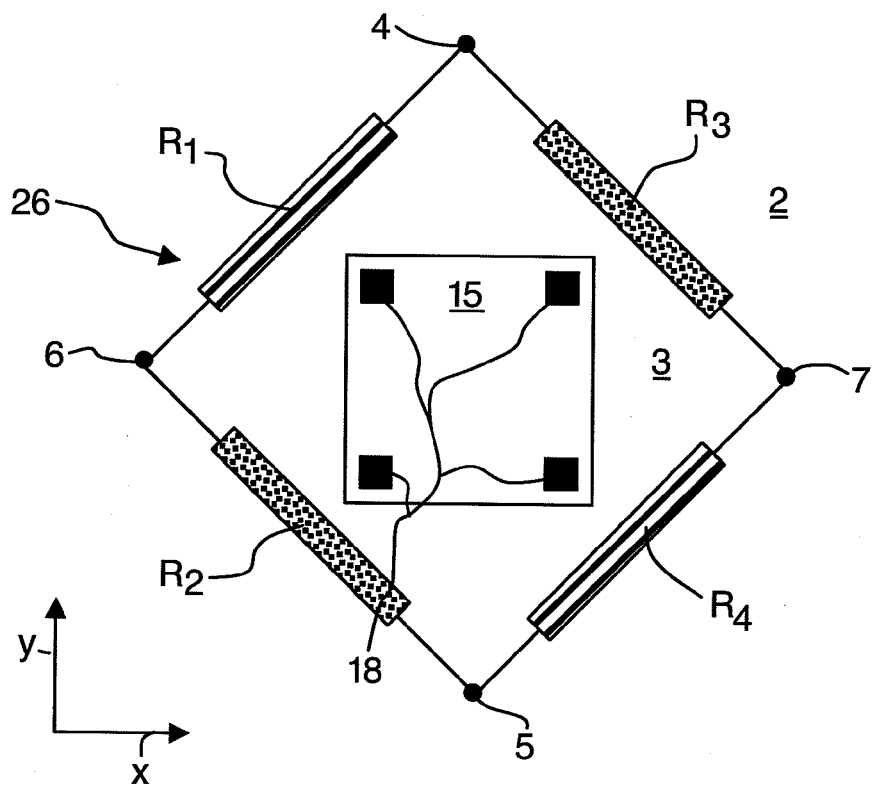
Figure 9:
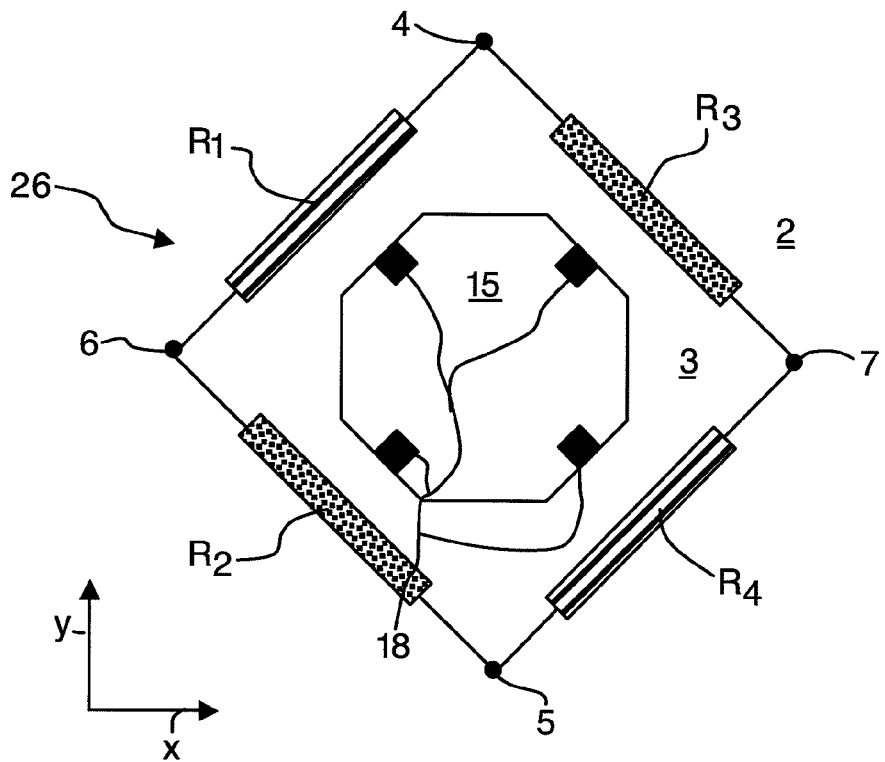
Figure 12:
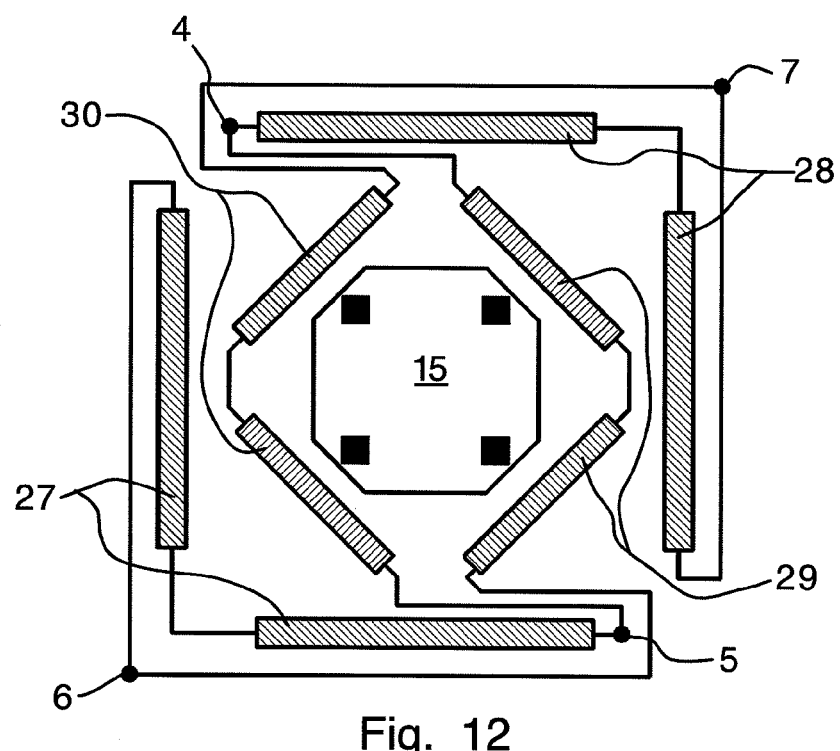
Figure 13:
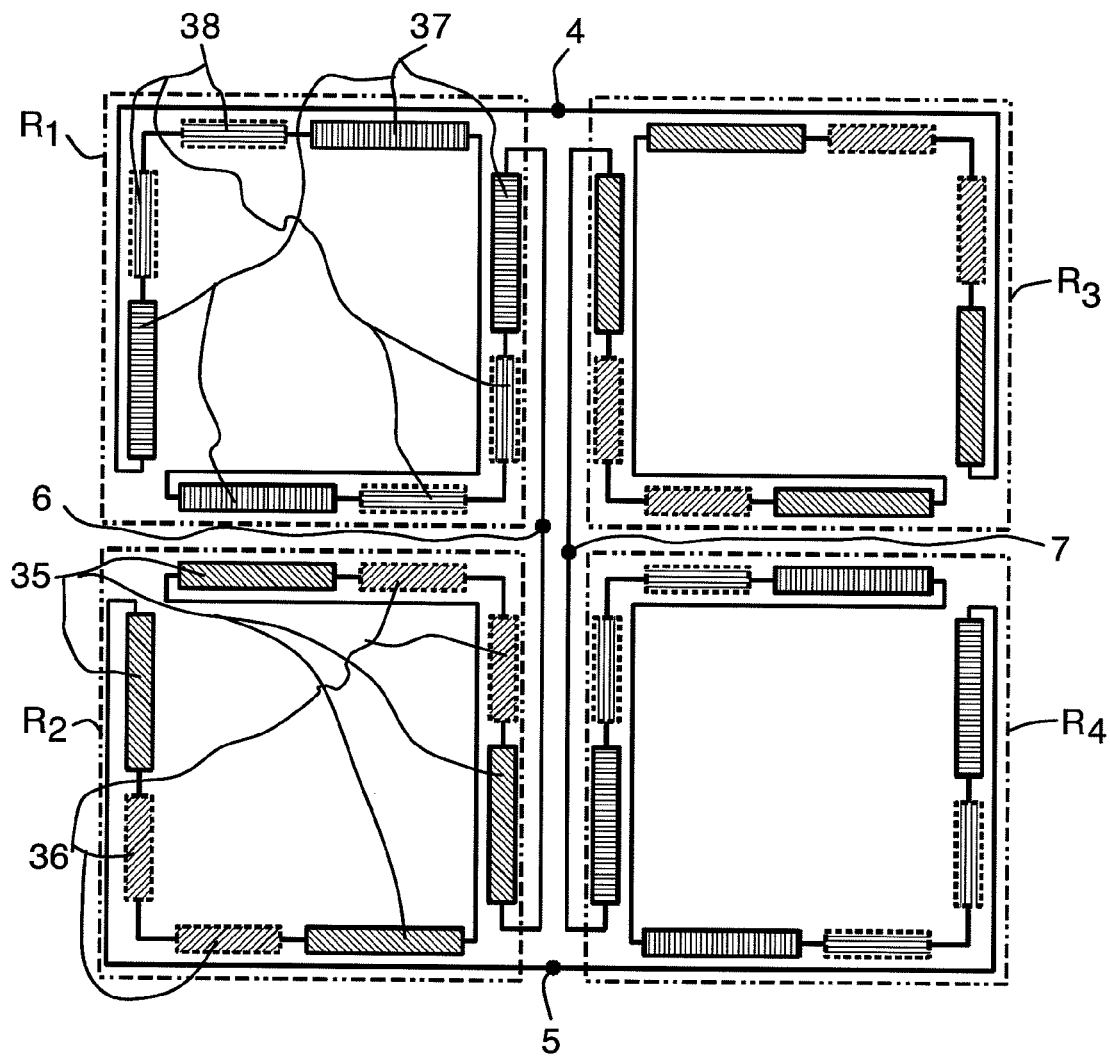
Figure 14A:
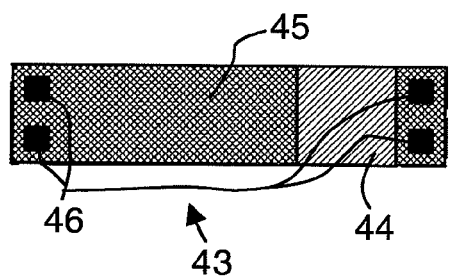
Figure 14B:
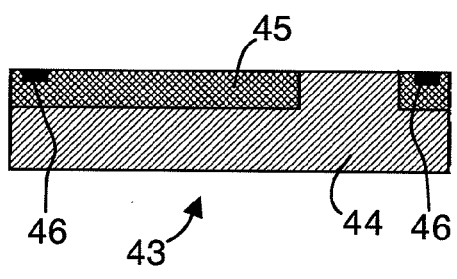
Figure 15:
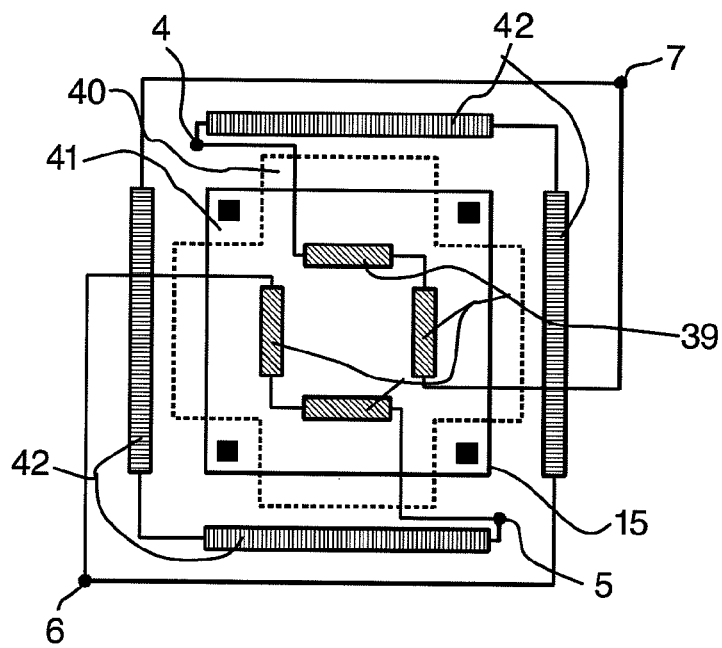
Figure 16:
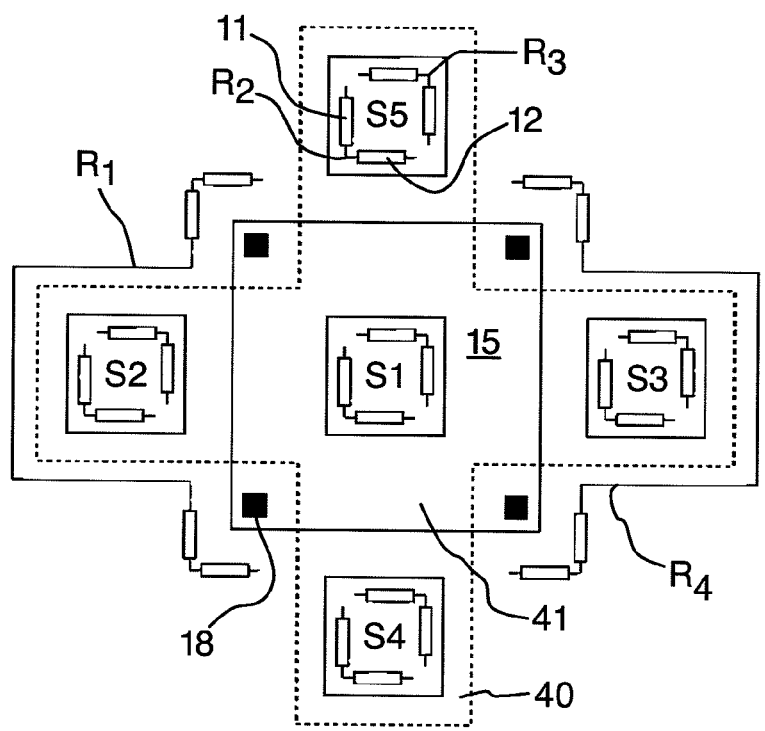
Figure 17:
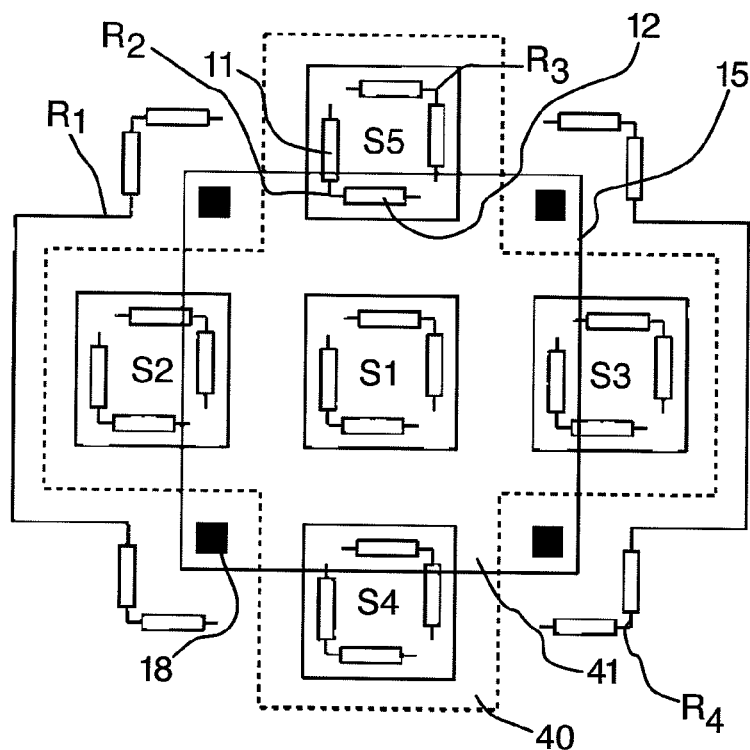
Figure 18:
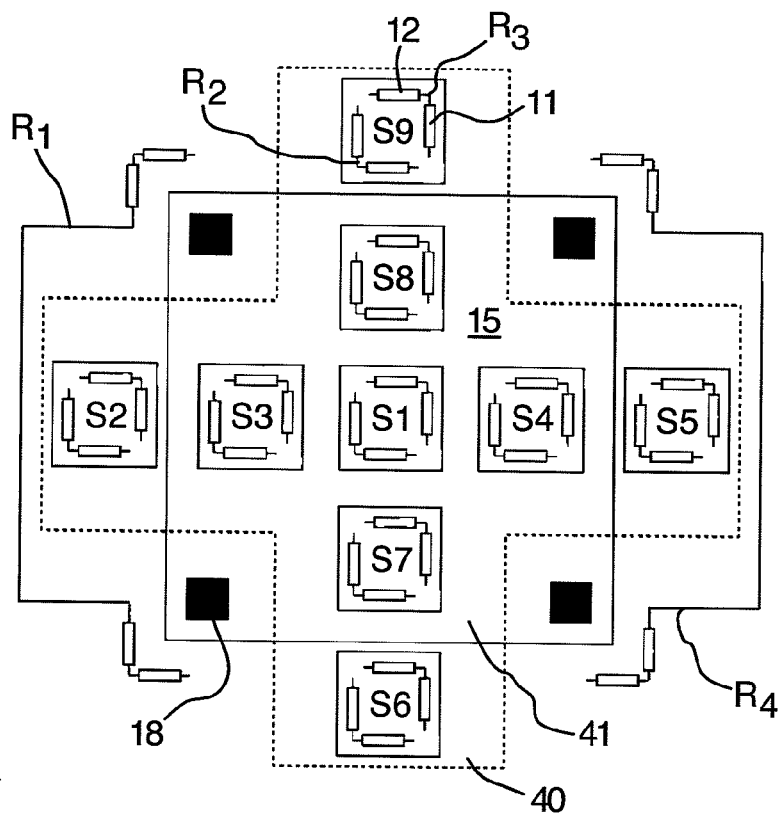

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 shows the electrical circuit diagram of a stress sensor according to the invention formed by resistors, FIG. 2 illustrates the internal structure of the resistors according to a first exemplary embodiment, FIGS. 3A-D show exemplary embodiments of the resistors, FIG. 4 shows a sensor cell which comprises a Hall element, a p-type resistor and an n-type resistor, FIG. 5 shows two sensor cells which form a stress sensor according to the invention and a Hall sensor, FIG. 6 shows a circuit for operating a Hall element, FIG. 7 shows a top view of a sensor cell which comprises a Hall element, two n-type resistors and two p-type resistors, FIGS. 8 to 11 show Hall sensors which comprise a Hall element and a stress sensor according to a second exemplary embodiment of the invention, FIG. 12 shows a further Hall sensor, FIG. 13 shows a further stress sensor according to the invention, FIGS. 14A, B show the outline and cross-section of a resistor strip, FIG. 15 shows a further Hall sensor having integrated stress sensor, and FIGS. 16 to 18 show a Hall sensor having several integrated stress sensors.

DETAILED DESCRIPTION OF THE PREFERRED EMBODIMENTS

FIG. 1 shows the electrical circuit diagram of the stress sensor 1 according to the invention. The stress sensor 1 consists of a Wheatstone bridge, formed by four resistors $R_1$, $R_2$, $R_3$ and $R_4$, which are integrated in a semiconductor chip 2. Hereafter, x, y and z designate the axes of a Cartesian coordinate system, the z-axis extending perpendicular to the active surface 3 of the semiconductor chip and the x-axis and y-axis extending parallel to the edges of the semiconductor chip which enclose the active surface 3. The resistors $R_1$ and $R_2$ are connected in series, the resistors $R_3$ and $R_4$ are connected in series and are connected in parallel to the resistors $R_1$ and $R_2$. The resistors $R_1$ and $R_3$ have a common node 4 and the resistors $R_2$ and $R_4$ have a common node 5, which are connectable to a voltage source or a power source. The resistors $R_1$ and $R_2$ have a common node 6 and the resistors $R_3$ and $R_4$ have a common node 7, via which the output signal $V_W$ of the Wheatstone bridge is tapped as a differential voltage signal and supplied to an amplifier circuit 8.

The resistors $R_1$, $R_2$, $R_3$ and $R_4$ have the following features:

1. The resistors $R_1$ and $R_4$ are p-type resistors, i.e., resistors having a p-type doping integrated in the semiconductor chip 2.
2. The resistors $R_2$ and $R_3$ are n-type resistors, i.e., resistors having an n-type doping integrated in the semiconductor chip 2.

The resistors $R_1$, $R_2$, $R_3$ and $R_4$ additionally preferably have the following features:

3. The nominal values of the four resistors $R_1$, $R_2$, $R_3$ and $R_4$ are, neglecting process-related tolerances, of equal size, i.e., $R_1=R_2=R_3=R_4$. This is achieved by a ratio of length to width of the resistor strips which corresponds to the layer resistances of the p-type doping or n-type doping.

4a) Each of the resistors $R_1$, $R_2$, $R_3$ and $R_4$ is composed of oblong resistor sections, which are connected to one another directly or via electrical conductors and form the resistor, each of the resistor sections having a predetermined orientation in the xy-plane defined by the active surface 3 of the semiconductor chip, a sum of the resistance values of all resistor sections which have a first orientation and belong to the same one of the resistors $R_1$, $R_2$, $R_3$, or $R_4$, and a sum of the resistance values of all resistor sections, which have a second orientation rotated by 90° to the first orientation and also belong to the same one of the resistors $R_1$, $R_2$, $R_3$, or $R_4$, having the same nominal value.

or

4b) The n-type resistors $R_2$ and $R_3$ are implemented as in feature 4a, the p-type resistors $R_1$ and $R_4$ are oblong resistor strips, which are rotated by 45° or −45° in relation to the edges of the semiconductor chip.

or

4c) The four resistors $R_1$, $R_2$, $R_3$, and $R_4$ are oblong resistor strips, which are rotated by 45° or −45° in relation to the edges of the semiconductor chip.

5a) The dopings used for the resistors $R_1$, $R_2$, $R_3$, and $R_4$ are preferably the heavily doped $N^+$ or $P^+$ dopings used for the production of the contacts.

or

5b) The n-type resistors $R_2$ and $R_3$ consist of heavily doped $N^+$ and comparatively lightly doped N material. The p-type resistors $R_2$ and $R_3$ consist of heavily doped $P^+$ material.

or

5c) The n-type resistors $R_2$ and $R_3$ consist of heavily doped $N^+$ and comparatively lightly doped N material. The p-type resistors $R_1$ and $R_4$ consist of heavily doped $P^+$ and comparatively lightly doped P material.

6. The currents flowing in the resistor sections flow essentially parallel to the active surface 3 of the semiconductor chip 2. The resistors $R_1$, $R_2$, $R_3$ and $R_4$ can therefore be designated as lateral resistors.

The Wheatstone bridge is typically located in the bulk material of the semiconductor chip, however, in certain applications it can also be integrated in an arbitrary microstructure of a microsensor, for example, exposed bending bars and diaphragms. A current or a voltage is applied thereto via the nodes 4 and 5.

FIG. 2 illustrates the internal structure of the resistors $R_1$, $R_2$, $R_3$ and $R_4$ according to a first exemplary embodiment of the stress sensor according to the invention, in which the resistors $R_1$, $R_2$, $R_3$ and $R_4$ are implemented according to the features 1, 2, 3, 4a, 5 and 6. The resistors $R_1$, $R_2$, $R_3$ and $R_4$ each have at least two oblong resistor strips 11 and 12, which have the same nominal resistance value, are rotated by 90° to one another, and are connected in series. In the example, the four resistor strips 11 are aligned parallel to the y-axis and the four resistor strips 12 are aligned parallel to the x-axis. The resistor strips 11 and 12 may also each be rotated by an arbitrary angle inside the plane spanned by the x-axis and the y-axis, however, it is solely important that their relative rotational orientation in regard to one another is maintained, i.e., that they lie in the xy-plane and enclose an angle of 90°. In the exemplary embodiment shown in FIG. 2, the resistor strips 11 and 12 of each of the resistors $R_1$, $R_2$, $R_3$ and $R_4$ are two individual resistor strips which are separate from one another, which are connected to one another by an electrical conductor and thus together result in the corresponding resistor $R_1$, $R_2$, $R_3$, or $R_4$.

The principle specified in feature 4a may be implemented most simply by a pair of oblong resistor strips, the two resistor strips of the pair being arranged rotated by 90° to one another in the xy-plane of the semiconductor chip 2 and being connected in series, as shown in FIG. 2. I.e., the two resistor strips of a pair together form an L-shaped resistor.

For standard (100) silicon having a <110> orientation of the flat, the dependence of the resistance values on the stress is approximately given by the following equations:

$$\Delta Rn/Rn = -24\%/GPa*(Txx+Tyy) + 53\%/GPa*Tzz \quad (1)$$

$$\Delta Rp/Rp = 2.7\%/GPa*(Txx+Tyy) - 1.1\%/GPa*Tzz \quad (2),$$

where Txx, Tyy and Tzz designate the three normal tension components of the mechanical tension tensor oriented in the direction of the x-axis or y-axis or z-axis, respectively. The specified percentage values (24%, 53%, 2.7%, and 1.1%) are to be understood as approximate values at a low level of doping and are independent of the rotational orientation of the silicon wafer in the case of (100) silicon.

Because Tzz is typically much less than Txx and Tyy in practice, the following equations apply:

$$\Delta Rn/Rn = -24\%/GPa*(Txx+Tyy) \quad (3)$$

$$\Delta Rp/Rp = 2.7\%/GPa*(Txx+Tyy) \quad (4).$$

The change of the resistance values of the n-type resistors caused by mechanical loads is, on the one hand, greater than the change of the resistance values of the p-type resistors by approximately one order of magnitude (approximately by the factor 9 here). The different size is a requirement so that the Wheatstone bridge formed by the resistors $R_1$ to $R_4$ delivers an output signal at all. The output signal $V_W$ of the Wheatstone bridge is proportional to the sum Txx+Tyy. On the other hand, the n-type resistors $R_2$ and $R_3$ have approximately similar temperature coefficients as the p-type resistors $R_1$ and $R_4$, with the result that the output signal $V_W$ of the Wheatstone bridge is only slightly influenced by temperature changes. The temperature coefficients of the heavily doped $N^+$ or $P^+$ resistors are less by approximately the factor 2.5 in the CMOS process used than the temperature coefficients of the less strongly doped n-wells or p-wells. This is the reason why the heavily doped $N^+$ or $P^+$ dopings are preferably used for the resistors.

The differential output signal $V_W$ of the Wheatstone bridge is supplied to the amplifier circuit 8 (FIG. 1), where it is converted into a differential signal by means of a first operational amplifier 9, for example, and offset-compensated by means of a second operational amplifier 10 by subtraction of a constant value $V_1$ and then provided as the output signal $V_S$ of the stress sensor 1.

FIG. 3A shows an exemplary embodiment of one of the resistors $R_1$, $R_2$, $R_3$ and $R_4$ in a top view of the active surface 3 of the semiconductor chip 2. The resistor is composed of multiple oblong resistor sections 13.1 to 13.4, each two resistor sections 13, of which one resistor section 13 is rotated by 90° in the xy-plane in relation to the other resistor section 13, having the same nominal resistance value and forming a pair. There are two pairs here: The resistor sections 13.1 and 13.3 form the first pair, the resistor sections 13.2 and 13.4 form the second pair. The resistor section 13.2 is rotated by the angle 45° in relation to the resistor section 13.1. The resistor section 13.4 is rotated by the angle 45° in relation to the resistor section 13.1. The resistor sections 13.1 to 13.4 can be connected to one another in series as shown by electrical conductors. In this case, the resistor sections can be located at arbitrary and different locations on the semiconductor chip 2. The resistor sections 13.1 to 13.4 can also be directly connected to one another as shown in FIG. 3B and form a single coherent resistor strip.

FIG. 3C shows a further exemplary embodiment of one of the resistors $R_1$, $R_2$, $R_3$ and $R_4$. The resistor is composed of five oblong resistor sections 13.1 to 13.5. The resistor sections 13.2, 13.3 and 13.4 have the same nominal resistance value R. The resistor sections 13.1 and 13.5 have the half resistance value R/2, they are therefore to be considered a common resistor section having the nominal resistance value R, which is geometrically split into two parts. The sum of the resistance values of the resistor sections 13.1, 13.3 and 13.5, which have an identical, first orientation, is 2*R and is equal to the sum of the resistance values of the resistor sections 13.2 and 13.4, which have an identical, second orientation, the first and second orientations being rotated by 90° to one another in the xy-plane defined by the active surface 3 of the semiconductor chip 2.

FIG. 3D shows a further exemplary embodiment of one of the resistors $R_1$, $R_2$, $R_3$ and $R_4$. The resistor is composed of oblong resistor sections 13.1 and 13.2, whose longitudinal axis extends either parallel to a first direction or parallel to a second direction orthogonal to the first direction. The sum of the resistance values of the resistor sections 13.1, which are aligned parallel to the first direction, is equal to the sum of the resistance values of the resistor sections 13.2, which are aligned parallel to the second direction. In principle, each resistor section 13.1 which is aligned parallel to the first direction is assigned a resistor section 13.2, which is aligned parallel to the second direction. The resistor sections 13.1 and 13.2 are arranged as closely adjacent to one another as allowed by the technology. This is not the case in the drawing for reasons of clarity. This arrangement of the resistor sections 13.1 and 13.2 results in a compact resistor, which occupies a small area and has a comparatively small scattering between the sum of the resistance values of the resistor sections 13.1 and the sum of the resistance values of the resistor sections 13.2.

The ratio of length to width of the resistor sections which are to be assigned to the same pair is in principle dimensioned so that a mechanical load by the normal tension component Txx causes an equally large change of the resistor formed by the resistor sections as a mechanical load by the normal tension component Tyy.

The stress sensor according to the invention is capable, for example, of compensating for the change of the sensitivity caused by the piezo-Hall effect in the case of a magnetic field sensor based on the Hall effect. FIG. 4 shows a top view of a sensor cell 14, which comprises a Hall element 15, an n-type resistor 16 and a p-type resistor 17. In this example, the Hall element 15 is a square n-well (or a p-well) and the four contacts 18 for the supply of the Hall current and the tapping of the Hall voltage are arranged in the corners of the square. The n-type resistor 16 is formed by four linear n-type resistor webs 19, which are aligned parallel to the four sides of the square n-well and are connected to one another by electrical conductor paths. Each two of the four n-type resistor webs 19 therefore extend parallel to the x-axis and the y-axis. The p-type resistor 17 is formed by four linear p-type resistor webs 20, which are aligned parallel to the sides of the square and are connected to one another by electrical conductor paths. Each two of the four p-type resistor webs 20 therefore extend parallel to the x-axis and the y-axis. The layout of the individual elements of the sensor cell 14 is implemented with the greatest possible symmetry, so that mechanical loads are distributed as uniformly as possible over the sensor cell 14.

FIG. 5 shows a top view of two sensor cells 14 of the type shown in FIG. 4. The two n-type resistors 16 and the two p-type resistors 17 of the two sensor cells 14 are wired as a Wheatstone bridge according to the electrical circuit diagram shown in FIG. 1 and form a stress sensor according to the invention. To illustrate the wiring, for reasons of clarity of the drawing, various lines are used, specifically solid, dashed and dotted lines. The two Hall elements 15 form, together with the electronic circuit necessary for their operation, a Hall sensor. The differential output signal $V_W$ of the Wheatstone bridge is supplied to an amplifier circuit 8, for example, the amplifier circuit 8 explained in FIG. 1, where it is amplified and the offset of the Wheatstone bridge is eliminated as much as possible, so that the output signal $V_S$ of the stress sensor is available as offset-compensated output signal.

FIG. 6 shows a preferred exemplary embodiment of how the output signal $V_S$ of the stress sensor shown in FIG. 5 is used in order to compensate for the change of the sensitivity related to the magnetic field of the two Hall elements 15, which is caused by the piezo-Hall effect. The change of the sensitivity of the two Hall elements 15 caused by the piezo-Hall effect is proportional in a first approximation to the sum Txx+Tyy of the mechanical loads acting in the x-direction and the y-direction.

The two Hall elements 15 are advantageously offset-compensated in a known way by parallel connection and operation using the spinning current method (see, e.g., EP 548391). The two Hall elements 15 are operated separately from one another using the spinning current method, each being powered by a separate constant current source, and then their output signals are added. FIG. 6 therefore only shows the electrical circuit diagram of the electronic circuit for one Hall element 15. The electronic circuit comprises four current sources 21 to 24 in this example, whose currents are added and/or subtracted and supplied to the Hall element 15 as the current I via a spinning current multiplexer 25. The Hall voltage appearing at the output of the multiplexer is an AC voltage, which can be processed and analyzed in a known way.

The first current source 21 is a PTAT constant current source (PTAT=proportional to absolute temperature) and delivers a current $I_1$, which is proportional to the absolute temperature. The second current source 22 is a CTAT constant power source (CTAT=complementary to absolute temperature) and delivers a current $I_2$, which decreases with increasing temperature. The third current source 23 is controlled by a temperature-independent resistor $R_Q$ and delivers a current $I_3$, which is independent of the temperature. The fourth current source 24 is controlled by the output signal $V_S$ of the stress sensor 1 and delivers a current $I_4$, which is proportional to the sum (Txx+Tyy).

$$I_1 = I_P^* [1 + a^*(T - T_0)]$$

$$I_2 = I_C^* [1 - b^*(T - T_0)]$$

$$I_3 = I_R$$

$$I_4 = c^* V_S$$

where $T_0$ is a selected fixed temperature and a and b are parameters given by the properties of the PTAT and CTAT constant current sources. $I_P$, $I_C$, $I_R$ and c are selectable parameters which are adapted to one another so that the sum of the currents $I_1$ to $I_4$ within a specific temperature range has the following behaviour:

$$I = I_1 + I_2 I_3 + I_4 = I_0^* [1 + \delta^*(T - T_0) + \lambda^* V_S] \quad (5)$$

The coefficients $\delta$ and $\lambda$ are constants, $I_0$ designates the current delivered by the current sources 21 to 24 at the temperature $T_0$ and in the absence of mechanical loads.

The temperature range in which the Hall element 15 is to be used is typically divided into multiple, e.g., three temperature ranges, in which the parameters $I_P$, $I_C$, $I_R$ and c are selected so that in each individual temperature range, on the one hand, the linear dependence of the current-related sensitivity of the Hall element and also the linear dependence of the output signal $V_S$ of the stress sensor on the temperature and, on the other hand, the dependence of the current-related sensitivity of the Hall element on mechanical loads are compensated for by the current I, and the quadratic dependence of the current-related sensitivity of the Hall element and the quadratic dependence of the output signal $V_S$ of the stress sensor on the temperature are also compensated for over all temperature ranges, so that the Hall voltage $U_H$ delivered by the Hall element 15 is substantially independent of the temperature T and of mechanical loads Txx and Tyy. For (100) silicon having <110> flat, the following current results:

$$I = I_0^* [1 + \delta^*(T - 25°\text{C.}) + \epsilon^*(T - 25°\text{C.})^2 + \lambda^* V_S]$$

where the constants $\delta$, $\epsilon$, and $\lambda$ had the following values in an experimental example:
$\delta$=300 ppm/° C.
$\epsilon$=5 ppm/° C.$^2$
$\lambda$=2.2/V It is known to be advantageous for reasons of offset compensation to operate two or more Hall elements in parallel and additionally using the spinning current method and to add their Hall voltages with the correct sign. The two Hall elements 15 of the Hall sensor shown in FIG. 5 are enclosed together by two n-type resistors 16 and two p-type resistors 17, which together form the Wheatstone bridge of the stress sensor 1. If the Hall sensor comprises four Hall elements 15, it is advantageous to also form the Hall sensor and the stress sensor 1 from sensor cells 14 of the type shown in FIG. 4. Since the Wheatstone bridge of the stress sensor 1 only requires four resistors, it can be formed, for example, in that two n-type resistors 16 and two p-type resistor 17 of the total of eight resistors are selected and the other four resistors are not used. Alternatively, all eight resistors of the four sensor cells 14 can be used, in that each two resistors of the same type are connected in series or in parallel and the Wheatstone bridge of the stress sensor 1 are formed therefrom. Another possibility is to provide two types of sensor cells, the first type comprising one Hall element and an n-type resistor enclosing the Hall element and the second type comprising one Hall element and a p-type resistor enclosing the Hall element.

FIG. 7 shows a top view of a sensor cell 14, which comprises a Hall element 15, two n-type resistors 16.1 and 16.2 and two p-type resistors 17.1 and 17.2. The n-type resistors 16.1 and 16.2 are each formed by two linear n-type resistor webs 19 arranged rotated to one another by 90°, which are aligned parallel to the sides of the square well of the Hall elements 15 and are connected to one another by electrical conductor paths. The p-type resistors 17.1 and 17.2 are each formed by two linear p-type resistor webs 20 arranged rotated to one another by 90°, which are aligned parallel to the sides of the square well of the Hall elements 15 and are connected to one another by electrical conductor paths. This sensor cell 14 therefore contains two n-type and two p-type resistors, which have all the properties necessary to form a stress sensor 1 according to the invention, and a Hall element, and therefore represent the simplest example in order to form a magnetic field sensor, which is substantially temperature-compensated and stress-compensated, according to the circuit diagram shown in FIG. 6, for example.

FIGS. 8 to 11 show further Hall elements which comprise a Hall element 15 (or a cluster of Hall elements) and a stress sensor 26 according to the invention. The stress sensor 26 again consists of a Wheatstone bridge formed by four resistors $R_1$, $R_2$, $R_3$ and $R_4$, which are integrated in a semiconductor chip 2. The resistors $R_1$ and $R_2$ are connected in series, the resistors $R_3$ and $R_4$ are connected in series and are connected in parallel to the resistors $R_1$ and $R_2$. The resistors $R_1$ and $R_3$ have a common node 4 and the resistors $R_2$ and $R_4$ have a common node 5, which are connectable to a voltage source or a current source. The resistors $R_1$ and $R_2$ have a common node 6 and the resistors $R_3$ and $R_4$ have a common node 7, via which the output signal of the Wheatstone bridge is tapped as a differential signal and supplied to an amplifier circuit. The resistors $R_1$ and $R_4$ are p-type resistors, the resistors $R_2$ and $R_3$ are n-type resistors.

If, proceeding from the structure of the resistors $R_1$, $R_2$, $R_3$ and $R_4$ shown in FIG. 2, a plurality of pairs of short resistor strips 11 and 12 are arrayed against one another, a stepped resistor is obtained, and if the resistor strips 11 and 12 are made infinitely short in the limit, an oblong resistor rotated by 45° or −45° in relation to the x-axis is obtained. The resistors $R_1$, $R_2$, $R_3$ and $R_4$ of the stress sensor 26 shown in FIGS. 8 to 11 are therefore implemented according to a second exemplary embodiment according to the feature 4c. In the exemplary embodiment of the Hall sensor shown in FIG. 11, the resistors $R_1$, $R_2$, $R_3$ and $R_4$ are arranged adjacent to the Hall element 15 and adjacent to one another, to achieve the smallest possible mismatch of the resistors $R_1$, $R_2$, $R_3$ and $R_4$. It is decisive in these exemplary embodiments that, as mentioned above, the edges of the semiconductor chip extend parallel to the x-axis or the y-axis.

The stress sensor 26 and the Hall element 15 (or a cluster of Hall elements) may be combined to form an optimum stress-compensated Hall sensor upon the use of (100) silicon with <110> flat, if the following conditions are met:

The resistors $R_1$, $R_2$, $R_3$ and $R_4$ are oblong resistors, which are rotated by 45° or −45° in relation to the <110> crystal direction of the silicon (the x-axis shown in the figures extends parallel to the <110> crystal direction).

The Hall element 15 (or the Hall elements of a cluster) has at least four contacts, which are aligned so that upon application of a current to two of these four contacts, the current flows through the Hall element 15 diagonally at an angle of 45° or −45° to the <110> crystal direction.

Since the edges of the semiconductor chip extend parallel and orthogonal to the flat, the resistors $R_1$, $R_2$, $R_3$ and $R_4$ are rotated by 45° or −45° in relation to the edges of the semiconductor chip.

The output signal $V_W$ of the Wheatstone bridge controls a current source, whose current is supplied to the Hall elements 15 as in the preceding examples to reduce the influence of mechanical loads.

Figure 10:
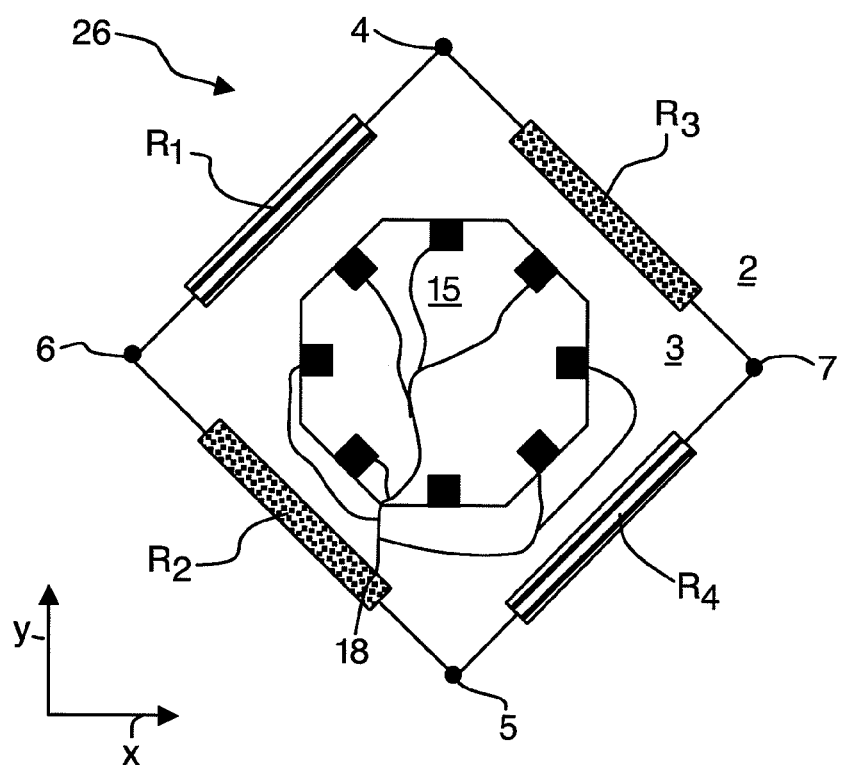
Figure 11:
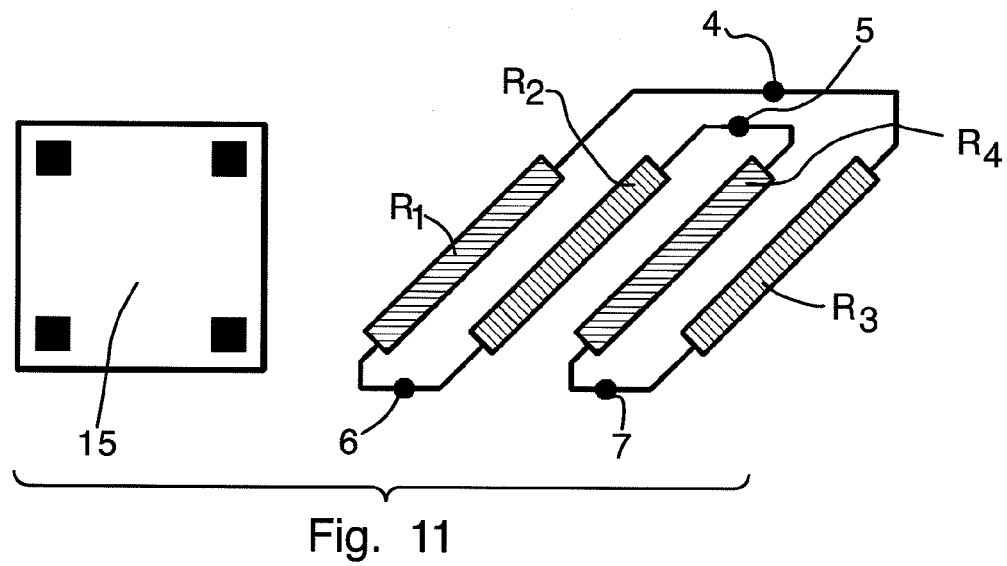

The Hall element 15 shown in FIG. 10 has an octagonal outline having eight sides of equal length and eight contacts 18, in each operating phase of the spinning current method, two diametrically opposed contacts being used as current contacts and two further diametrically opposed contacts, which are arranged rotated by 90° thereto, being used as voltage contacts. The current flows in the individual operating phases in each case at an angle of 0°, 45°, −45°, or 90° to the <110> crystal direction.

FIG. 12 shows a further exemplary embodiment of a Hall sensor, which comprises a stress sensor according to the invention and a Hall element 15. The basic material is standard (100) silicon having a <110> orientation of the flat. The edges of the semiconductor chip extend parallel and orthogonal to the flat. A first pair of oblong resistor strips 27, which are aligned at 0° and at 90° to the flat, forms the n-type resistor $R_2$, a second pair of oblong resistor strips 28, which are aligned at 0° and at 90° to the flat, forms the n-type resistor $R_3$. The p-type resistors $R_1$ and $R_4$ are composed of at least one pair of oblong resistor strips 29 or 30, which are aligned at −45° and at +45° to the flat and therefore extend parallel to the <100> crystal direction. The two resistor strips of each pair are implemented according to the feature 4a, i.e., together they form a L-shaped resistor. The orientation of the n-type resistors parallel to the <110> crystal directions decreases the resistor mismatch, because for n-type silicon, the difference $\pi_{11} - \pi_{12}$ of the piezo-coefficients $\pi_{11}$ and $\pi_{12}$ along the <110> crystal axes is comparatively small. The orientation of the p-type resistors parallel to the <100> crystal directions decreases the scattering of the resistance values, because for p-type silicon the difference $\pi_{11} - \pi_{12}$ of the piezo-coefficients $\pi_{11}$ and $\pi_{12}$ along the <100> crystal axes is comparatively small. In order to minimize the influence of the currents flowing through the resistors $R_1$ to $R_4$ on the Hall element 15, the eight resistor strips 27 to 30 of the four resistors $R_1$ to $R_4$ are wired so that the currents flowing through the resistor strips 27 flows counterclockwise, the current flowing through the resistor strips 28 flows clockwise, the current flowing through the resistor strips 29 flows clockwise, and the current flowing through the resistor strips 30 flows counterclockwise around the Hall element 15. The conductor paths which connect the resistors $R_1$ to $R_4$ to one another are only shown for the sake of completeness in FIG. 12, they are implemented in the scope of the technological possibilities so that the current which flows through them has no influence on the output signal of the Hall element 15 as far as possible.

FIG. 13 shows a further exemplary embodiment of a stress sensor 1 according to the invention, in which the four resistors $R_1$ to $R_4$ are implemented according to the features 4a and 5c and are optimized in various aspects. For each of the resistors $R_1$ to $R_4$, the following conditions apply:

1. Each resistor consists of four resistor sections, two of which are aligned parallel to a first direction, and the other two of which are aligned parallel to a second direction orthogonal to the first direction.
2. Each of the four resistor sections consists of two resistor strips connected in series, whose doping is different. The dopings used for the n-type resistors $R_2$ and $R_3$ are a heavily doped $N^+$ doping, preferably the $N^+$ doping used for the production of the contacts, for the first resistor strip, and a moderate N doping, preferably the doping used for the production of the well of the Hall element, i.e., the doping typically designated as n-well, for the second resistor strip. The dopings used for the p-type resistors $R_1$ and $R_4$ are a heavily doped $P^+$ doping, preferably the $P^+$ doping used for the production of contacts, for the first resistor strip and a moderate P doping, preferably the doping typically designated as p-well, for the second resistor strip. The resistor strips having the $N^+$ doping are designated by the reference sign 35, the resistor strips having the n-well doping are designated by the reference sign 36, the resistance strips having the $P^+$ doping are designated by the reference sign 37, and the resistor strips having the p-well doping are designated by the reference sign 38. Identical resistor strips are shown having an identical border and shading, because of which the reference signs of the resistor strips of the resistors $R_3$ and $R_4$ were left out for reasons of clarity.

The $N^+$ resistor strip and the n-well resistor strip have different temperature coefficients, in addition, the piezoresistive coefficients of heavily doped and lightly doped semiconductor material have different temperature drifts. The ratio of the resistance value of the N⁺ resistor strip and the n-well resistor strip of each resistor section is dimensioned so that the temperature drift of the stress-dependent resistance change is equal to the piezo-Hall temperature coefficients. This is illustrated in the following example. In the abbreviations:

TC_n⁺ designates the temperature coefficient of N⁺ material

TC_n$_{well}$ designates the temperature coefficient of n$_{well}$ material

TC_p⁺ designates the temperature coefficient of P⁺ material

TC_p$_{well}$ designates the temperature coefficient of p$_{well}$ material

TC_πn⁺ designates the piezoresistive temperature coefficient of N⁺ material

TC_π$_{nwell}$ designates the piezoresistive temperature coefficient of n$_{well}$ material TC_ph designates the piezo-Hall temperature coefficient of the hall plate R__$_{N+}$ designates the resistance of an N⁺ resistor strip R__n$_{well}$ designates the resistance of an n-well resistor strip R__$_{P+}$ designates the resistance of a P⁺ resistor strip R__p$_{well}$ designates the resistance of a p-well resistor strip α, β, γ, η designate proportionality parameters The resistance $R_n$ of a resistor section formed from a N⁺ resistor strip and a n-well resistor strip is thus $$R_n = R\_{\_N+} + R\_n_{well}$$

Given that $$R\_{\_N+} = \alpha * R_n$$

$$R\_n_{well} = \beta * R_n$$

In this case a α+β=1. The ratio α/β is determined by the equation $$\alpha * TC\_\pi n^+ + \beta * TC\_\pi_{nwell} = TC\_ph$$

which incorporates the fact that the temperature drift of the stress-dependent resistance change is equal to the piezo-Hall temperature coefficient.

The P⁺ resistor strips and the p-well resistor strips also have different temperature coefficients. The ratio of the resistance value of the P⁺ resistor strip and the p-well resistor strip of each resistor section is dimensioned so that the temperature drift of the stress-independent resistance change of the p-type resistors $R_1$ and $R_4$ is equal to the temperature drift of the stress-independent resistance change of the n-type resistors $R_2$ and $R_3$, so that the temperature coefficient of the output signal $V_W$ of the Wheatstone bridge formed by the resistors $R_1$ to $R_4$ is equal to zero.

The resistance $R_p$ of a resistor section formed from a P⁺ resistor strip and a p-well resistor strip is thus $$R_p = R\_{\_P+} + R\_p_{well}$$

Given that $$R\_{\_P+} = \gamma * R_p$$

$$R\_p_{well} = \eta * R_p$$

In this case γ+η=1. The ratio γ/η is determined by the equation $$\alpha * TC\_n^+ + \beta * TC\_n_{well} = \gamma * TC\_p^+ + \eta * TC\_p_{well}$$

In order that the Wheatstone bridge formed from the resistors $R_1$ to $R_4$ is offset free, $R_p = R_n$ must be true.

The values thus obtained for the proportionality values α, β, γ and η are approximate values, which are dependent on how precisely the material constants used in the equations are known, and require eventually an experimental correction.

3. The eight resistor strips of a resistor are electrically connected to one another so that
   a) the current flows in opposing directions through the two resistor sections which have the same orientation,
   b) the sequence of the resistor sections is alternating with respect to their orientation, i.e., resistor section of first orientation, resistor section of second orientation, resistor section of first orientation, and resistor section of second orientation, or vice versa,
   c) the sequence of the eight resistor strips is as follows:
      N⁺, n-well, n-well, N⁺, N⁺, n-well, n-well, N⁺ or P⁺, p-well, p-well, P⁺, P⁺, p-well, p-well, P⁺

These measures are used for the purpose of minimizing the scattering of the resistor values $R_1$ to $R_4$, which originate from effects of greatly varying types, for example, influences of the space charge zones, influences of ion implantation, etc.

Since the influence of the temperature drift of the piezoresistive coefficient is much less in the p-type resistors $R_1$ and $R_4$ than in the n-type resistors $R_2$ and $R_3$, the implementation of the p-type resistor sections as two resistor strips having different doping is not absolutely necessary, i.e., the p-type resistor sections can alternatively be a single P⁺ resistor strip.

The resistors $R_1$ to $R_4$ of a stress sensor 1 according to the invention can be combined in arbitrary ways in the scope of the above-mentioned features and exemplary embodiments and implemented in manifold ways and arranged on the semiconductor chip 2 and combined with at least one Hall element to form a stress-compensated Hall sensor. In order to minimize the influence of the magnetic field which is generated by the currents flowing through the resistor strips or resistor sections on the at least one Hall element, the resistor strips or resistor sections are advantageously arranged so that the current or the currents flow once clockwise and once counterclockwise around the Hall element.

FIGS. 14A and B show an outline and a cross-section of an exemplary embodiment in which the resistor strips 35 and 36 of an n-type resistor section of FIG. 13 are implemented as combined to form a single resistor strip 43. The resistor-strip 43 consists of an n-well 44, in which a strip 45 of N⁺ material is integrated. The contact terminals 46 are arranged as usual in the N⁺ region. One part of the current therefore flows through the N⁺ region, another part flows through the n-well region. The resistor strips 37 and 38 of a p-type resistor section of FIG. 13 can be implemented similarly.

FIG. 15 shows a further exemplary embodiment of a Hall sensor, which comprises a Hall element 15 and a stress sensor 1 according to the invention. In this exemplary embodiment, the two n-type resistors $R_2$ and $R_3$ consist of two N⁺ resistor strips 39 aligned orthogonally to one another, which are arranged in a p-well 40, which is in turn arranged over the n-well 41 of the Hall element 15. The p-well 40 is cross-shaped in this example, the arms of the cross protruding laterally beyond the n-well 41. The p-type resistors $R_1$ and $R_4$ consist of two P⁺ resistor strips 42 aligned orthogonally to one another. This embodiment allows the measurement of the stress directly at the location of the Hall element 15.

In all Hall sensors which comprise at least one Hall element and at least one stress sensor according to the invention, the output signal of the Wheatstone bridge of the stress sensor is used to compensate for the influence of stress on the output signal of the Hall element, for example, according to the solution shown in FIG. 6. However, the output signal of the Wheatstone bridge of the stress sensor can also be digitized and then used for compensation of the output signal of the Hall element, which is also digitized.

FIGS. 16 to 18 each show a Hall sensor, which comprises a Hall element 15 having five or nine integrated stress sensors, respectively, which are accordingly identified by S1 to S5 or S1 to S9. Each of these stress sensors can be implemented as a stress sensor according to one of the above-described exemplary embodiments, a preferred embodiment is shown in FIGS. 16 to 18 and will be explained in greater detail here. The stress sensors S1 to S5 or S9 each comprise separate n-type resistors while the p-type resistors $R_1$ and $R_4$ are shared by all of them and are accordingly connected in operation by means of (not shown) switches to record the measuring signal of one stress sensor after the other. The n-type resistors $R_2$ and $R_3$ are "L-shaped" resistors, which each have at least two oblong resistor strips 11 and 12, which have the same nominal resistance value, are rotated by 90° to one another, and are connected in series. For reasons of clarity of the drawing, the n-type resistors $R_2$ and $R_3$ are only identified in the stress sensor S1 and the resistor strips 11 and 12 are only identified in the resistor $R_2$ of the stress sensor S1. The n-type resistors are integrated, as in the exemplary embodiment shown in FIG. 15, in a p-well 40, which is embedded in the n-well 41 of the Hall element and is preferably cross-shaped as shown and exposes the Hall contacts 18. The p-type resistors $R_1$ and $R_4$ are also "L-shaped" resistors, which are arranged around the Hall element 15. The p-type resistors $R_1$ and $R_4$ preferably each consist as shown of at least four oblong resistor strips connected in series, which have the same nominal resistance value, each two resistor strips being rotated by 90° in relation to the other two resistor strips.

The stress sensors are arranged in a cross shape, specifically, three or five stress sensors are arranged along the x-axis and three or five stress sensors are arranged along the y-axis, the stress sensor S1 being arranged in the center of the two axes and in the center of the Hall element 15.

The course of the mechanical stress component sigma=Txx+Tyy as a function of the location x or the location y can be represented as $$\text{sigma}(x) = A_0 + A_1 {}^*x + \ldots + A_n {}^*x^n$$

$$\text{sigma}(y) = B_0 + B_1 {}^*x + \ldots + B_n {}^*x^n$$

In operation of the Hall sensor, the coefficients $A_0$ to $A_n$ and $B_0$ to $B_n$ up to the order n are determined from the output signals of the stress sensors arranged along the x-axis and the stress sensors arranged on the y-axis by means of typical mathematical methods. The order n is at most 2 in the embodiments of FIGS. 16 and 17, and is at most 4 in the embodiment of FIG. 18.

The coefficients $A_0$ to $A_n$ and $B_0$ to $B_n$ are multiplied by weighting factors $k_0$ to $k_m$ and then added to form a stress signal $V_S$:

$$V_S = k_0{}^*A_0 + k_1{}^*A_1 + k_2{}^*A_2 + \ldots + k_{m/2}{}^*A_n + k_{m/2+1}{}^*B_0 + \ldots + k_{m-1}{}^*B_{n-1} + k_m{}^*B_n$$

The Hall current through the Hall element 15 is then preferably stress-compensated according to equation (6).

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A stress sensor for detecting mechanical stress in a semiconductor chip, the stress sensor having four resistors $R_1$ to $R_4$ integrated in an active surface of the semiconductor chip, the resistors $R_1$ to $R_4$ forming a Wheatstone bridge, in which the resistors $R_1$ and $R_2$ are connected in series, the resistors $R_3$ and $R_4$ are connected in series and in parallel to the resistors $R_1$ and $R_2$ the resistors $R_1$ and $R_3$ have a common node and the resistors $R_2$ and $R_4$ have a common node, the resistors $R_1$ and $R_4$ being p-type resistors and the resistors $R_2$ and $R_3$ being n-type resistors wherein each of the n-type resistors $R_2$ and $R_3$ consists of oblong resistor sections, which are connected to one another directly or via electrical conductors, each of the resistor sections has a predetermined orientation in the plane defined by the active surface of the semiconductor chip, and a sum of the resistance values of all resistor sections which have a first orientation and belong to the same resistor $R_2$ or $R_3$ and a sum of the resistance values of all resistor sections which have a second orientation rotated by 90° to the first orientation and also belong to the same resistor $R_2$ or $R_3$ have a same nominal value.

2. The stress sensor according to claim 1, wherein each of the p-type resistors $R_1$ and $R_4$ consists of oblong resistor sections, which are connected to one another directly or via electrical conductors, each of the resistor sections has a predetermined orientation in the plane defined by the active surface of the semiconductor chip, and a sum of the resistance values of all resistor sections which have a first orientation and belong to the same resistor $R_1$ or $R_4$ and a sum of the resistance values of all resistor sections which have a second orientation rotated by 90° to the first orientation and also belong to the same resistor $R_1$ or $R_4$ have the same nominal value.

3. The stress sensor according to claim 2, wherein the resistor sections of the n-type resistors $R_2$ and $R_3$ and the resistor sections of the p-type resistors $R_1$ and $R_4$ enclose an angle of 45° or −45°.

4. The stress sensor according to claim 3, wherein each of the p-type resistors $R_1$ and $R_4$ is an oblong resistor, which is rotated by 45° or −45° in relation to an edge of the semiconductor chip.

5. The stress sensor according to claim 2, wherein the base material (100) is silicon, the edges of the semiconductor chip extend parallel and orthogonal to the <110> crystal direction, the resistor sections of the n-type resistors $R_2$ and $R_3$ extend parallel or orthogonal to the <110> crystal direction, and the resistor sections of the p-type resistors $R_1$ and $R_4$ extend parallel or orthogonal to the <100> crystal direction.

6. The stress sensor according to claim 2, wherein the n-type resistors $R_2$ and $R_3$ comprise comparatively heavily doped and comparatively lightly doped semiconductor material, these semiconductor materials combined so that a temperature drift of the stress-dependent resistance change of the n-type resistors $R_2$ and $R_3$ is equal to a piezo-Hall temperature coefficient.

7. The stress sensor according to claim 6, wherein the p-type resistors $R_1$ and $R_4$ comprise comparatively heavily doped and comparatively lightly doped semiconductor material, these semiconductor materials combined so that a temperature drift of the stress-independent resistance change of the p-type resistors $R_1$ and $R_4$ is equal to the temperature drift of the stress-independent resistance change of the n-type resistors $R_2$ and $R_3$.

8. A Hall sensor, comprising at least one Hall element and at least one stress sensor according to claim 2, an output signal of the at least one stress sensor used to stress-compensate the output signal of the at least one Hall element.

9. The stress sensor according to claim 1, wherein each of the resistors $R_1$, $R_2$, $R_3$ and $R_4$ is an oblong resistor which is rotated by 45° or −45° in relation to an edge of the semiconductor chip.

10. The stress sensor according to claim 1, wherein the n-type resistors $R_2$ and $R_3$ comprise comparatively heavily doped and comparatively lightly doped semiconductor material, these semiconductor materials combined so that a temperature drift of the stress-dependent resistance change of the n-type resistors $R_2$ and $R_3$ is equal to a piezo-Hall temperature coefficient.

11. The stress sensor according to claim 10, wherein the p-type resistors $R_1$ and $R_4$ comprise comparatively heavily doped and comparatively lightly doped semiconductor material, these semiconductor materials combined so that a temperature drift of the stress-independent resistance change of the p-type resistors $R_1$ and $R_4$ is equal to the temperature drift of the stress-independent resistance change of the n-type resistors $R_2$ and $R_3$.

12. A Hall sensor, comprising at least one Hall element and at least one stress sensor according to claim 10, an output signal of the at least one stress sensor used to stress-compensate the output signal of the at least one Hall element.

13. A Hall sensor, comprising at least one Hall element and at least one stress sensor according to claim 1, an output signal of the at least one stress sensor used to stress-compensate the output signal of the at least one Hall element.

14. The Hall sensor according to claim 13, wherein at least two current sources for applying a current to the at least one Hall element, the output signal of the stress sensor controlling one of the at least two current sources.

15. The Hall sensor according to claim 14, wherein at least five stress sensors are provided, which are arranged along two axes extending orthogonally to one another, and a single output signal is formed from the output signals of the stress sensors for controlling one of the at least two current sources.

16. The Hall sensor according to claim 13, wherein at least five stress sensors are provided, which are arranged along two axes extending orthogonally to one another, and a single output signal is formed from the output signals of the stress sensors in order to stress-compensate the output signal of the at least one Hall element.

\* \* \* \* \*